United States Patent [19]
Niimi

[11] Patent Number: 4,517,728
[45] Date of Patent: May 21, 1985

[54] MANUFACTURING METHOD FOR MIS-TYPE SEMICONDUCTOR DEVICE

[75] Inventor: Morihiro Niimi, Tokyo, Japan

[73] Assignee: Clarion Co., Ltd., Tokyo, Japan

[21] Appl. No.: 559,399

[22] Filed: Dec. 8, 1983

Related U.S. Application Data

[63] Continuation-in-part of Ser. No. 342,651, Jan. 25, 1982, abandoned.

[30] Foreign Application Priority Data

Jan. 27, 1981 [JP] Japan .................................. 56-9627

[51] Int. Cl.³ .......................................... H01L 21/22
[52] U.S. Cl. ...................................... 29/571; 29/578; 148/187
[58] Field of Search ................... 29/571, 578; 148/187

[56] References Cited

U.S. PATENT DOCUMENTS

| | | | |
|---|---|---|---|
| 3,576,478 | 4/1971 | Watkins et al. | 148/175 X |
| 4,095,251 | 6/1978 | Dennard et al. | 29/571 X |
| 4,210,993 | 7/1980 | Sunami | 29/571 |
| 4,455,737 | 6/1984 | Godejahn | 29/571 |
| 4,461,072 | 7/1984 | Wada et al. | 29/571 |

Primary Examiner—G. Ozaki
Attorney, Agent, or Firm—Stephen R. Arnold; Russell E. Hattis

[57] ABSTRACT

A manufacturing method for an MIS type semiconductor device features in the preferred form a single masking operation used to define source, gate, and drain windows simultaneously in an upper insulating oxide layer disposed over a semiconducting polysilicon layer, the polysilicon layer being separated from the semiconductor substrate by a thin insulating oxide layer serving as the gate oxide. By subsequent deposition of an overall capping nitride layer, followed by selective removal of layers, using relatively low resolution photoresist and portions of the layers themselves as intermediate etching barriers, and by finally converting the polycrystalline layer to an oxide except where it is protected from oxidation by the presence of a nitride stripe over a gate window, the resulting gate electrode is precisely centered between the source and drain windows, and is sealed on all three sides by a protective oxide layer.

19 Claims, 11 Drawing Figures

MANUFACTURING METHOD FOR MIS-TYPE SEMICONDUCTOR DEVICE

RELATED APPLICATION

This application is a continuation-in-part of U.S. patent application Ser. No. 342,651, filed Jan. 25, 1982, now abandoned.

TECHNICAL FIELD OF THE INVENTION

The technical field of the invention is semiconductor process technology, in particular metal-insulator-semiconductor device technology.

BACKGROUND OF THE INVENTION

This invention relates to a manufacturing method for an MIS-type semiconductor device.

In an MIS-type semiconductor device, it is necessary to make the distances between gate and source as well as between gate and drain as small as possible to improve its characteristics. FIG. 1 shows a sectional view illustrating an MIS semiconductor device fabricated by a conventional method wherein the reference numeral 1 designates an N-type silicon substrate, 2 a P-type source region, 3 a P-type drain region, 4 an oxide layer, 5 a source electrode, 6 a gate electrode and 7 a drain electrode, respectively. Such an MIS-type semiconductor device is made by photoresist etching of a substrate material using a mask on which a pattern of source and drain is previously drawn, and next re-etching with another mask on which a gate pattern is drawn. There is a problem, however, in that the distances between the gate and the source as well as between the gate and the drain are not always same due to registry errors which may happen upon putting the masks on the substrate, thereby causing variability of the characteristics of the devices. Further, since enough space must be reserved to accommodate this error, the actual effective area decreases with respect to the total necessary device fabrication area.

FIG. 2 illustrates an MIS-type semiconductor device fabricated by another method in order to eliminate the above-mentioned drawbacks, where the source, gate and drain are formed by using one mask in a self-alignment manner. With this method, since each region is formed in self-alignment, the registry error problem between these two masking steps is eliminated. However, the distances between the gate and the source as well as between the gate and the drain are small, thus causing the drawback that the capacity between the gate and the source as well as the gate and the drain is increased undesirably. In particular, overlap of the gate and drain regions must be avoided if device speed is to be maximized. Alternatively, when using a metallic material like molybdenum to form electrode structures, it is necessary to form the regions of the source and the drain by an ion implantation method, thus raising the production cost. Moreover, both of the foregoing methods as shown leave the high-field regions of the gate electrode 6 unprotected from surface contaminants, giving rise to drift instability from ion migration.

SUMMARY OF THE INVENTION

A manufacturing method for an MIS-type semiconductor device on a semiconducting substrate of a given conductivity type which comprises:

forming a first insulating layer on said substrate;

forming a semiconducting layer on said first insulating layer;

forming a second insulating layer on said semiconducting layer;

selectively removing portions of said second insulating layer to expose said semiconducting layer so as to define windows for source, gate, and drain;

forming a capping or doping barrier layer over said substrate, so that said capping layer contacts and covers the remaining portions of said second insulating layer and said semiconducting layer within said windows;

selectively removing said capping layer except for a region containing and extending beyond said gate window, so as to expose said semiconducting layer in said source and drain windows;

selectively removing said semiconducting layer in said source and drain windows;

removing said second insulating layer so as to leave a first portion of said capping layer in contact with that portion of said semiconducting layer defining said gate window and so as to leave the remaining portion of said capping layer separated at a stand-off distance from said semiconducting layer, and selectively removing said first insulating layer in said source and drain windows to expose said substrate within said source and drain windows;

selectively doping to a given depth those semiconducting substrate regions within said source and drain windows to a given semiconducting type and concentration, said doping type being opposite to that of said substrate conductivity type, and converting the remaining portion of said semiconducting layer to an insulating layer so that said remaining portion is so converted except where said capping layer is in contact therewith;

removing the remaining portion of said capping layer, so as to expose said semiconducting layer in said gate window; and forming source and drain electrodes to said doped substrate regions and a gate electrode to said semiconducting layer in said gate window.

In the exemplary method the semiconducting substrate is silicon, the first and second insulating layers are silicon dioxide, the semiconducting layer is polysilicon, the capping layer is silicon nitride, and the conversion of the semiconducting layer is by means of oxidation to silicon dioxide.

It is therefore a feature of the present invention to eliminate the above-mentioned drawbacks of other fabrication methods, more particularly to provide a manufacturing method for a semiconductor device by forming an oxide layer on a polycrystalline semiconductor layer and photographically etching the oxide layer using a mask whereon a pattern of source, gate and drain is drawn, and to sealingly protect the interior corners of the gate electrode.

Not only is precise centering of the gate electrode achieved, but the silicon dioxide layers effectively seal the lateral edge regions of the resulting polycrystalline drain contact to provide increased stability against ion drift effects arising from surface contamination.

Other advantages and features of the invention will become apparent upon making reference to the description to follow, the drawings, and the claims.

DESCRIPTION OF THE INVENTION

Figure 1:
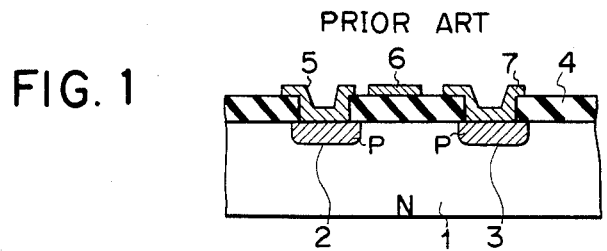
FIG. 1 and FIG. 2 show cross sectional views illustrating MIS semiconductor devices made by two conventional manufacturing methods, respectively.
Figure 2:
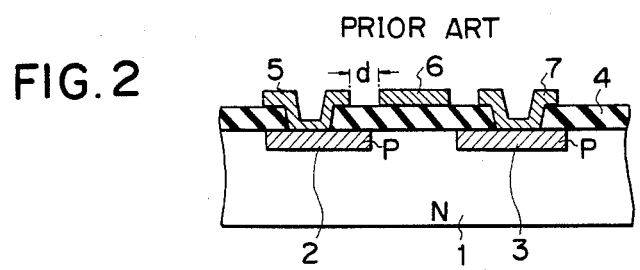

The present invention will now be described in detail, referring to the preferred embodiment illustrated in the drawings of FIG. 3A to FIG. 3I.

Figure 3A:
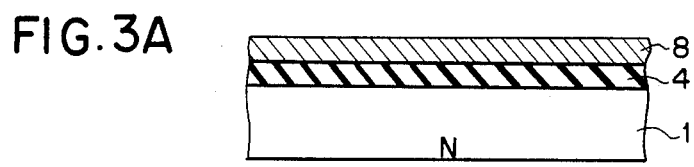
FIGS. 3A–3I show cross sectional views illustrating the manufacturing method according to the present invention and in accordance with the process described herein.

Process (a): As shown in FIG. 3A, a semiconductor substrate, taken to be N-type silicon for purposes of illustration, has formed thereon a first insulating layer 4 and a semiconductor layer 8 such as, for example, polysilicon, said layers being formed to a pre-determined thickness by any of a variety of well known techniques. This first insulating layer will subsequently serve as the insulating layer under the gate electrode, and will normally in the preferred embodiment be a silicon dioxide layer grown to a thickess of 1,000–1,500 A°. This layer may be grown by a variety of wet or dry oxidation techniques well known in the art. The semiconducting layer is preferably polysilicon grown to a thickness of 4,000–5,000 A°., and may be prepared by pyrolytic decomposition of silane gas. As will subsequently be shown, this semiconducting layer will only remain in the finished structure immediately under the gate contact, over which will be provided a highly conducting metalizing stripe, as a result of which this semiconducting polysilicon layer need only be doped to form an adequate low-resistance contact thereto.

Depending on the actual choice of contacting material employed, the polysilicon semiconducting layer may be doped to a variety of levels and/or types by use of such well known additives as phosphene, diborane, or similar compounds which will decompose during the formation of the polysilicon to give the desired P or N type doping thereto. Such techniques have long been well established in the art.

Figure 3B:
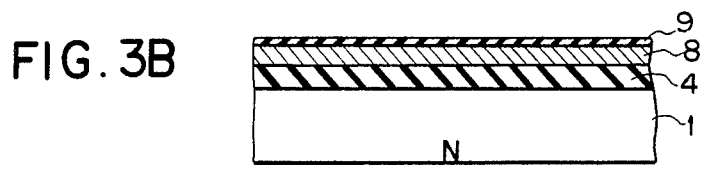

Process (b): As shown in FIG. 3B, a second insulating layer 9, preferably silicon dioxide, is formed on the polysilicon layer 8. This layer 8 is preferably deposited to a thickness of 1,000–1,500 A°, and may be deposited by a variety of methods including a controlled vapor deposition (CVD) method, or alternatively by heating the structure for a controlled period of time in an oxidizing atmosphere to oxidize the upper portion of the polysilicon layer.

Figure 3C:
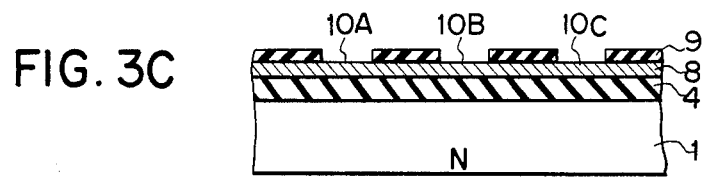

Process (c): As shown in FIG. 3C, by means of a photoresist etching process using a mask (not shown) whereon a pattern of windows for the source, gate, and drain is drawn, the second oxide layer 9 is selectively removed to form windows 10A, 10B, and 10C. The window 10A defines the source, the window 10B the gate, and the window 10C, the drain, respectively. Here the only requirement placed upon the etching reagent is that it be capable of attacking silicon dioxide without attacking conventional photoresistant material. As is well known in the art, either dilute hydrofluoric acid, or more customarily a buffered composition consisting of hydrofluoric acid and ammonium fluoride, may be employed.

Figure 3D:
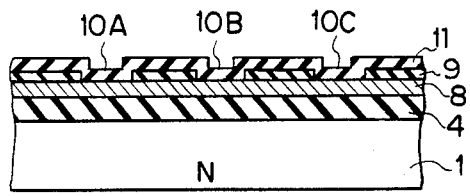

Process (d): As shown in FIG. 3D, a barrier or capping layer 11, preferably a nitrified compound such as silicon nitride, for example, is formed so as to cover the entire upper surface of the structure. This layer may be formed, for example, by pyrolytic cracking of silane and ammonia from the gas phases thereof, or alternatively by reacting them in a plasma, or equally well by cathodic sputtering of silicon in a nitrogen atmosphere, all of the foregoing techniques being well known in the art. This layer is adjusted to have a thickness of preferably 1,000–1,500 A°. For reasons that will become evident, the capping layer 11 must be capable of withstanding whatever processes are used for doping (e.g. diffusion), etching of the semiconducting layer 8, and etching of the first and second oxide layers 4 and 9.

Figure 3E:
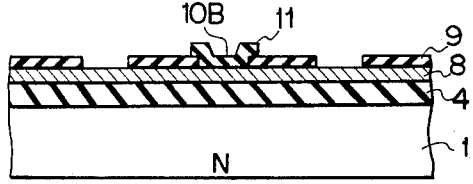

Process (e): As shown in FIG. 3E, by using a conventional photoresist masking of the region of the gate window 10B, all remaining nitride is removed except for a small region 11 covering the gate window 10B and a small portion of the immediately adjacent oxide layer. The removal of such nitride layers using photo-resist masking is a well known technique in the semiconductor industry, a representative etch for this process being phosphoric acid. The mask used for this process is not shown in FIG. 3E; however, its dimensioning may readily be inferred from the shape of the resulting pattern.

Figure 3F:
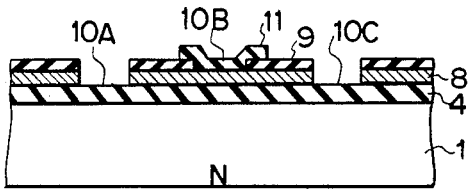

Process (f): As shown in FIG. 3F, the polysilicon layer is removed from the source and drain windows 10A and 10C respectively, using the oxide layer 9 and the nitride layer 11 as a mask for removal of a polysilicon layer. An etchant of approximate composition HF:HNO$_3$:H$_3$PO$_4$ = 1:20:5 may be employed for this purpose.

Figure 3G:
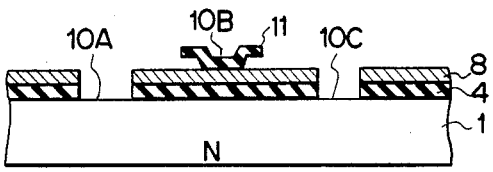

Process (g): As shown in FIG. 3G the remaining upper oxide layer 9 is removed, as is the oxide layer in the source and drain windows 10A and 10C respectively, most readily by simple immersion etching using, for example, the previously mentioned buffered fluoride etchant. It will be noted that the outer portions of the nitride capping layer 11 are now spaced apart at a standoff distance from the semiconducting layer 8 except for the gate window contact region 10B.

Figure 3H:
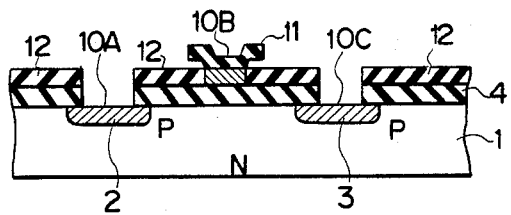
Figure 3I:
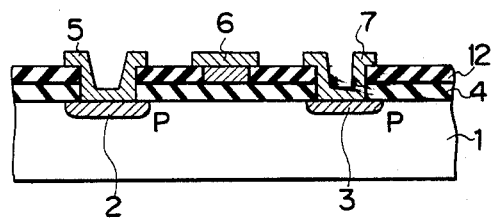

Process (h): As shown in FIG. 3H, a P-type source region 2 and drain region 3 are formed by selectively diffusing impurities through the windows 10A and 10C. This step is preferably to be carried out in an oxidizing atmosphere so that as the P-type source and drain regions are formed, the polysilicon layer 8 is oxidized generally overall to become insulating silicon dioxide. This may be done in a variety of doping oxidizing diffusing atmospheres well known in the art. The resulting thin layer of glass formed over the diffused regions 2 and 3, as well as over the now converted polycrystalline layer 12, may be removed by a conventional quick rinse in very dilute hydrofluoric acid, a technique also well known in the art.

It will be noted in FIG. 3H that the nitride cap 11 acts as an oxidation and diffusion barrier, a long recognized property of such layers, so that the upper oxide layer resulting from conversion of the polycrystalline layer to silicon dioxide only extends as far as the contact region between the nitride cap 11 and the upper surface of the oxide layer 12, with the result that an unconverted centrally located stripe of polycrystalline material remains centered in the gate window 10B.

Process (i): As shown in FIG. I, after removing the nitride cap 11, for example, by immersion of the entire structure into the previously mentioned phosphoric acid etch, the source, gate, and drain electrodes 5, 6, and 7 respectively are formed. This is accomplished by laying down a suitable contacting material such as aluminum over the substrate by well known means, typically by vacuum evaporation, these stripes being thereafter defined by conventional photoresist methods using a single three-stripe mask followed by a conventional aluminum etch of one of the various types well known in the art. Wafer processing is now complete.

As previously explained, according to the present invention a photoresist etching treatment is done on an insulating layer formed on a semiconductor layer using a single mask carrying a pattern of source, gate, and drain thereon. The distances betweens the gate and source as well as between the gate and the drain can be maintained to high precision owing to the self-alignment feature described herein, and the width of impurity diffusion towards source and drain regions can be precisely controlled.

Furthermore, it is possible to keep the electrical characteristics of the device stable since the degree of protection is increased by oxidizing the polysilicon layer to form an insulating layer so that the lower face of the polysilicon gate stripe is completely surrounded by oxide. This feature thus seals the local high field regions under the edges of the gate stripe, thereby substantially suppressing surface ion migration effects, a notorious source of device instability.

While for the purpose of illustration, various forms of this invention have been disclosed, other forms thereof may become apparent to those skilled in the art upon reference to this disclosure and, therefore, this invention shall be limited only by scope of the appended claims. Thus, for example, one central concept of the invention which allows for maintaining proper gate centering is the employment of an expendable intermediate layer, e.g. the upper insulating layer 9, used not only as an etching mask, but also to provide a stand-off distance to the gate-masking capping layer 11 so that oxidizing agents may act on the convertible semiconducting layer 8 clear to the edges of the gate boundary. This concept, along with the various remaining aspects of the fabrication, is not inherently restricted to any particular layer substances or etch chemistries, but constitutes a broadly novel principle of device fabrication having the evident advantages pointed out herein.

I claim:

1. A manufacturing method for an MIS-type semiconductor device on a semiconducting substrate of a given conductivity type which comprises:

forming a first insulating layer on said substrate;

forming a semiconducting layer on said first insulating layer;

forming a second insulating layer on said semiconducting layer;

selectively removing portions of said second insulating layer to expose said semiconducting layer so as to define windows for source, gate, and drain;

forming a capping or doping barrier layer over said substrate, so that said capping layer contacts and covers the remaining portions of said second insulating layer and said semiconducting layer within said windows;

selectively removing said capping layer except for a region containing and extending beyond said gate window, so as to expose said semiconducting layer in said source and drain windows;

selectively removing said semiconducting layer in said source and drain windows;

removing said second insulating layer so as to leave a first portion of said capping layer in contact with that portion of said semiconducting layer defining said gate window and so as to leave the remaining portion of said capping layer separated at a stand-off distance from said semiconducting layer, and selectively removing said first insulating layer in said source and drain windows to expose said substrate within said source and drain windows;

selectively doping to a given depth those semiconducting substrate regions within said source and drain windows to a given semiconducting type and concentration, said doping type being opposite to that of said substrate conductivity type, and converting the remaining portion of said semiconducting layer to an insulating layer so that said remaining portion is so converted except where said capping layer is in contact therewith;

removing the remaining portion of said capping layer, so as to expose said semiconducting layer in said gate window; and forming source and drain electrodes to said doped substrate regions and a gate electrode to said semiconducting layer in said gate window.

2. The method of claim 1 wherein said selective doping is achieved by a high-temperature diffusion process.

3. The method of claim 1, wherein said selective removal of portions of said second insulating layer comprises etching of said windows by using a photographically produced pattern of etching barriers, said pattern being produced from a single mask carrying a pattern of said source, gate, and drain windows thereon.

4. The method of claim 1 wherein said selective removal of said capping layer except for a region containing and extending beyond said gate window comprises etching said capping layer by using a photographically produced etching barrier to maskingly define said region.

5. The method of claim 1 wherein said selective removal of said semiconducting layer in said source and drain windows includes etching said semiconducting layer using said first portion of said capping layer and said second insulating layer as an etching barrier.

6. The method of claim 1 wherein said removal of said second insulating layer so as to leave a first portion of said capping layer in contact with said gate window region and said selective removing of said first insulating layer in said source and drain windows are performed simultaneously by an etching process using said semiconducting layer as a pattern-defining masking barrier.

7. The method of claim 1 wherein said selective removal of said first insulating layer in said source and drain windows includes etching said first insulating layer using said semiconducting layer as a pattern-defining etching barrier.

8. The method of claim 1 wherein said selective doping is carried out using that portion of the remaining capping layer in contact with said semiconducting layer and at least said first insulating layer as pattern-defining doping barriers.

9. The method of claim 1 wherein said selective doping and said conversion of said remaining semiconductor layer are performed as a simultaneous process.

10. The method of claim 9 wherein said simultaneous doping and conversion process includes an oxidizing process which converts said semiconducting layer to an insulator.

11. The method of claim 10 wherein said selective doping and conversion process includes a diffusion process in an atmosphere having a substantial fraction of free oxygen therein.

12. The method of claim 1 wherein said first insulating layer is a silicon dioxide layer.

13. The method of claim 1 wherein said semiconducting layer is a polysilicon layer and said conversion thereof includes oxidation of said polysilicon layer to an oxide of silicon.

14. The method of claim 1 wherein said second insulating layer is a silicon dioxide layer.

15. The method of claim 1 wherein said capping layer is a silicon nitride layer.

16. A manufacturing method for an MOS-type semiconductor device which comprises:
   forming a first oxide layer, a polycrystalline semiconductor layer and a second oxide layer in that order on a semiconductor substrate;
   selectively and partially removing said second oxide layer to form windows for source, gate and drain;
   forming a nitrified layer so as to cover said second oxide layer and said windows;
   removing said nitrified layer except that covering the window for the gate;
   removing said polycrystalline semiconductor layer in regions corresponding to said windows for the source and the drain;
   removing said second oxide layer;
   removing said first oxide layer in said source and drain windows;
   forming a doped source region and a doped drain region in the semiconductor substrate and adjacent to the windows for the source and the drain, respectively and converting the remaining polycrystalline semiconductor layer to an insulator except where said nitrified layer is in contact therewith; and
   removing said nitrified layer corresponding to the window for gate and providing the respective drain windows with a source electrode, a gate electrode and a drain electrode.

17. The manufacturing method as claimed in claim 16 wherein said polycrystalline semiconducting layer formed in said process for forming a first oxide layer, a polycrystalline semiconductor layer and a second oxide layer in that order on a semiconductor substrate is a polysilicon layer.

18. The manufacturing method as claimed in claim 17 wherein said nitrified layer formed in said process for forming a nitrified layer is a nitrified silicon layer.

19. The manufacturing method as claimed in claims 16, 17, or 18, wherein said process for selectively and partially removing said second oxide layer comprises the selective removal of said second oxide layer by a photographic etching treatment with a mask having a pattern of source, gate and drain.

* * * * *